United States Patent [19]

Iida et al.

[11] Patent Number: 4,923,718

[45] Date of Patent: May 8, 1990

[54] FUNCTIONAL FILM AND PROCESS FOR ITS PRODUCTION

[75] Inventors: Kosuke Iida; Hiroshi Yamato; Yoji Kadono, all of Osaka, Japan

[73] Assignee: Takiron Co., Ltd., Osaka, Japan

[21] Appl. No.: 172,723

[22] PCT Filed: Oct. 8, 1987

[86] PCT No.: PCT/JP87/00761

§ 371 Date: Feb. 10, 1988

§ 102(e) Date: Feb. 10, 1988

[87] PCT Pub. No.: WO88/02761

PCT Pub. Date: Apr. 21, 1988

[30] Foreign Application Priority Data

| Mar. 14, 1987 | [JP] | Japan | 62-59675 |
| May 29, 1987 | [JP] | Japan | 137438 |
| May 29, 1987 | [JP] | Japan | 62-137436 |
| May 29, 1987 | [JP] | Japan | 137437 |
| Sep. 11, 1987 | [JP] | Japan | 62-228729 |
| Sep. 11, 1987 | [JP] | Japan | 62-228728 |
| Oct. 14, 1987 | [JP] | Japan | 61-244858 |

[51] Int. Cl.[5] .................................. B05D 3/02
[52] U.S. Cl. ........................... 427/386; 427/387; 427/393.5; 428/339
[58] Field of Search .............. 427/393.5, 386, 387; 428/339

[56] References Cited

FOREIGN PATENT DOCUMENTS

| 1070575 | 1/1980 | Canada . |
| 50-54670 | 5/1975 | Japan . |
| 50-146686 | 11/1975 | Japan . |
| 58-98334 | 6/1983 | Japan . |
| 58-136941 | 8/1983 | Japan . |
| 59-219335 | 12/1984 | Japan . |
| 60-24552 | 2/1985 | Japan . |
| 61-94948 | 5/1986 | Japan . |
| 61-108639 | 5/1986 | Japan . |

*Primary Examiner*—Michael Lusignan
*Attorney, Agent, or Firm*—Sughrue, Mion, Zinn, Macpeak & Seas

[57] ABSTRACT

Functional films comprising a thermoplastic resin having formed thereon a coating layer and a process for their production are disclosed. The films have improved properties including improved heat resistance, are inexpensive, and are for general-purpose. They are produced by baking a thin film of a phenol resin, an epoxy resin, a silicone resin, etc., onto a thermoplastic resin substrate and can be utilized for flexible printed circuit base, insulating tapes, etc.

10 Claims, 2 Drawing Sheets

100 BASE SUBSTRATE

100 BASE SUBSTRATE

4,923,718

FUNCTIONAL FILM AND PROCESS FOR ITS PRODUCTION

TECHNICAL FIELD

This invention relates to a functional film comprising a base substrate composed of a thermoplastic resin having formed thereon a coating layer to improve heat resistance, fire retardance, elongation resistance, solvent resistance, properties of not absorbing water, etc., and to a process for its production. The term "film" as used herein is a term of wide conception including film analogues of sheets, etc.

BACKGROUND ART

Thermoplastic resin-based flexible films permit a high degree of freedom in designing due to their flexibility and possess some insulating properties. In general, however, their insufficient heat resistance limits their uses. Of conventional non-treated films used as base substrates, films composed of engineering plastics such as polyimide (PI), polyether-ether-ketone (PEEK), polyether sulfone (PES), polyphenylene sulfide (PPS), polyparabanic acid (PPA), polyarylate (PAR), etc., have a comparatively excellent heat resistance. However, these films themselves are expensive and require highly sophisticated working techniques which make them more expensive, thus being difficultly used for general purpose uses. Therefore, in recent years, films using inexpensive thermoplastic resin as base substrate and yet having better heat resistance than non-treated films composed of the base substrate itself have been variously studied and, as a result, various such films have actually been proposed.

For example, among them is a film using as base substrate a composition prepared by mixing polyvinyl chloride resin (PVC), a typical example of inexpensive and easily available thermoplastic resins, with predetermined additives. However, in many cases, the technique of mixing with additives to improve heat resistance of base substrate requires to mix various additives for the purpose of obtaining intended heat resistance properties, thus the technique has been pointed out to involve the problem that transparency and other physical values are seriously changed by the mixing of various additives.

A heat-resistant film prepared by impregnating a sheet of heat-resisting fibers or glass fibers with a heat-resistant resin, and laminating the impregnated sheet on a known film also exists. However, this film has a too much thickness and loses a tendency of flexibility, and hence is not sufficiently adapted for uses requiring particularly thin thickness and good flexibility such as flexible printed circuit base (FPC), insulating tapes, etc.

On the other hand, it may also be considered to form a coating layer on a base substrate composed of a thermoplastic resin for attaining heat resistance properties not obtained by the base substrate per se. Such films have the possibility of providing good heat resistance not obtained by the base substrate per se due to the coating layer without much spoiling the physical properties of the base substrate per se such as transparency. As a process for producing such film, it may be generally considered to bake the coating layer to the substrate under the condition of low temperature under which the base substrate composed of thermoplastic resin does not shrink or wrinkle. However, heat resistance, adhesion, etc., of film having a coating layer correlate with the baking temperature and, when baking is conducted under such low temperature, it is feared that the degree of improvement of heat resistance is comparatively small.

As is described above, even heat-resistant film prepared by forming a coating layer on a base substrate composed of a thermoplastic resin fails to markedly improve heat resistance, and existing heat-resistant films have problems with thickness, flexibility, and cost and, when they are mixed with additives to improve heat resistance, other physical properties of them will be spoiled. Thus, these have been still insufficient as heat-resistant films.

With these in mind, the present invention has been completed, and its object is to provide an inexpensive functional film having good heat resistance, fire retardance, properties of not absorbing water, solvent resistance, chemical resistance, optical properties, elongation-contraction resistance upon being heated, high degree of freedom in designing, adhesion between base substrate and coating layer, etc., and excellent general purpose properties, and to provide a process for its production.

DISCLOSURE OF THE INVENTION

In order to attain the above-described object, the functional film of the present invention is characterized in that the film comprises a base substrate composed of a flexible thermoplastic resin having on one or both sides thereof a coating layer formed by baking a thin film of one, two or more resins selected from among a phenol resin, an epoxy resin, a melamine resin, a silicone resin, a fluorine resin, a polyimide resin, a polyamidoimide resin, a polyparabanic acid resin, and a polyhydantoin resin.

The process of the present invention for producing such functional film is characterized in involving a step of forming a thin film on one or both sides of a base substrate composed of a flexible thermoplastic resin using a solution of one, two or more resins selected from among a phenol resin, an epoxy resin, a melamine resin, a silicone resin, a fluorine resin, a polyimide resin, a polyamidoimide resin, a polyparabanic acid resin, and a polyhydantoin resin, and a step of baking said thin film with keeping the thin film-formed base substrate in a flatly form-retaining state without looseness.

Additionally, in this specification, it is apparent to those skilled in the art that "resin" for producing the functional film of the present invention be construed as including modified resins or derivatives thereof, too.

The functional film of the present invention has a good flexibility since its base substrate is composed of a flexible thermoplastic resin, which permits high degree of freedom in designing, and is less expensive than engineering plastics. In addition, since the coating layer is formed by baking a thin film of one, two or more resins selected from among a phenol resin, an epoxy resin, a melamine resin, a silicone resin, a fluorine resin, a polyimide resin, a polyamidoimide resin, a polyparabanic acid resin, and a polyhydantoin resin at temperatures of as high as 130° to 300° C., the functional film of the present invention has good heat resistance, fire retardance, properties of not absorbing water, solvent resistance, chemical resistance, elongation-contraction resistance upon heating, adhesion between base substrate and coating layer in spite of the fact that the base substrate is composed of a thermoplastic resin. Further, the base substrate per se has good optical properties, particularly transparency.

On the other hand, in the process of the present invention for producing the film, baking is conducted with keeping the thin film-formed base substrate in a flatly form-retaining state without looseness. Hence, wrinkles or the like spoiling film properties are not formed even at a baking temperature of as high as 130° to 300° C., and a functional film with high evenness can be easily produced.

DETAILED DESCRIPTION OF THE PREFERRED EMBODIMENT

Figure 1:
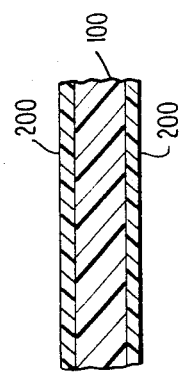
FIG. 1 is a cross-sectional view showing one embodiment of the functional film in accordance with the present invention.

According to a preferred embodiment, the functional film of the present invention has a three-layer structure as shown in FIG. 1, wherein coating layers 200 are formed on both sides of base substrate 100. Needless to say, however, film of a two-layer structure wherein coating layer 200 is formed only on one side of base substrate 100 is also within the scope of the present invention.

This base substrate 100 is composed of a flexible thermoplastic resin such as polyvinyl chloride resin (PVC), polycarbonate resin (PC), polyarylate resin (PAR), polyethylene terephthalate resin (PET), polyphenylenesulfide resin (PPS), polysulfone resin (PSF), polyether sulfone resin (PES), polyether imide resin (PEI), triacetate resin (TAC), methyl methacrylate resin (MMA), etc.

The base substrate composed of PC has excellent mechanical strength, particularly impact resistance, and is also excellent in dimensional stability, secondary workability to film, gas permeability, moisture permeability, etc. In addition, as to its electric properties, it has a stable dielectric constant and an excellent volume intrinsic resistance and a low dielectric loss tangent (tan δ). The base substrate of PET has an excellent tear strength and a high flexibility, and the base substrate composed of PPS, PSF, PES or PEI has excellent heat resistance and contraction resistance at high temperatures. These PPS, PSF, PES, and PEI are not presently popular, but are expected to increase its general purpose properties and to be available inexpensively in the future. The base substrate composed of MMA is excellent in transparency, plane properties, nerve, flexibility, durability, and mechanical strength, whereas TAC is excellent in heat resistance in addition to the above-described properties, thus being used for photographic films, sound-recording tapes, electric insulating materials, etc. PVC and PAR are also satisfactorily used as base substrate. Of the above-described thermoplastic resins, PET, PPS, PSF, PES, and PEI (hereinafter these being grouped as a first resin group) have excellent solvent resistance, whereas PVC, PC, PAR, TAC, and MMA (hereinafter these being grouped as a second resin group) have poor solvent resistance.

Thickness of the base substrate is preferably within the range of 1 to 1,000μ in view of workability. When it is thinner than 1μ, there result poor handling properties and insufficient strength whereas, when thicker than 1,000μ, the degree of freedom in designing might become insufficient. However, since a more preferable range of the thickness of base substrate 100 varies depending upon the combination of the kind of resin forming base substrate 100 and the kind of resin forming coating layer 200, it will be described in more detail hereinafter. Additionally, in the case of intending to obtain only heat resistance, thickness of the base substrate 100 may be more than 1,000μ.

On the other hand, the coating layer 200 is a layer formed by coating a resin solution (coating solution) on the base substrate 100 and baking the thus formed thin film. As the resin for forming the coating layer, one, two or more resins selected from among phenol resin, epoxy resin, melamine resin, polyimide resin (PI), polyamidoimide resin (PAI), polyparabanic acid resin (PPA), polyhydantoin resin (PH), fluorine resin, and silicone resin are used.

As the phenol resin, both straight phenol resins and modified phenol resins may be used, and it does not matter whether the resin is of resol type or not. Straight phenol resins are obtained by reacting phenol or cresol with formalin in the presence of a catalyst. In the case where high insulating properties are required for the coating layer, a reaction product between cresol and formalin is desirably used in view of workability in the production step. As a catalyst to be used in such occasion, an alkali catalyst such as ammonia, amine or the like is suitable, but a strongly polar catalyst such as NaOH is not suitable since it increases water-absorbing properties when remaining in the coating layer thereby reducing insulating properties. Compounding ratios of formalin to phenol or cresol varies depending upon the end-use of the functional film, but is about 1.0 to 5.0 in molar ratio for FPC or the use of insulating film. As the modified phenol resin, there are illustrated aralkyl-modified, epoxy-modified, melamine-modified, alkylphenol-modified, cashew-modified, rubber-modified, oil-modified, furfural-modified, hydrocarbon-modified, or inorganic material-modified (e.g., $B_2O_3$, $P_2O_5$) phenol resins, etc. Of these, particularly melamine- or epoxy-modified phenol resin assures a high adhesion for base substrate 100. Of these two, the epoxy-modified phenol resin shows a particularly high adhesion. This adhesion also varies depending upon the baking temperature to be described hereinafter. If a high baking temperature (e.g., 200° C. or more ) is employed, enough heat resistance and adhesion can be obtained by using a straight phenol resin. However, if a low baking temperature is employed, the use of modified phenol resins as described above is advantageous for obtaining sufficient adhesion. As solvents for phenol resins, alcohols such as methanol (b.p. 64° C.), isopropyl alcohol (b.p. 82° C.), ethanol (b.p. 78° C.), 1-propanol (b.p. 97° C.), butanol (b.p. 99.5° C.), etc., ketones such as methyl ethyl ketone (MEK; b.p. 80° C.), methyl isobutyl ketone (MIBK; b.p. 116° C.), acetone (b.p. 56.1° C.), etc., toluene (b.p. 110° C.), xylene (b.p. 140° C.), etc., are used. A proper one is selected according to the boiling point of the solvent in order to improve workability in preparing a coating solution (dissolving workability) and wetting and adhering properties of the coating solution for base substrate 100. However, when the base substrate 100 is composed of a resin belonging to the second resin group inferior in solvent resistance, the solvent is properly selected from among alcohols. Additionally, it is needless to say that the above-described solvents may be used alone or in combination of two or more. As to preferable compounding proportions of the phenol resin component and the solvent, 10 to 30 parts (by weight, hereinafter the same) of, for example, a straight phenol resin is used per 90 to 70 parts of a solvent of, for example, a mixture of methanol and isopropyl alcohol. If the amount of resin component is less than 10 parts, resulting coating solution has a poor storage stability and causes such disadvantages as secondary agglomeration and, if it exceeds 30 parts, the resulting coating solution has too high viscosity, thus workability in coating procedure becoming poor and a coating layer of a uniform thickness becoming difficult to form and, in addition, foaming or an orange peel takes place upon baking to make the surface state bad. If necessary, a surfactant or an organic or inorganic, or metallic fine powder filler may properly be added to the coating solution. As such organic fine powder filler, fine powders of, for example, Si-Ti-C-O type or benzoguanamine, etc., are used. As such inorganic fine powder filler, fine powders of, for example, silicon carbide or boron nitride are used and, as the metallic fine powder filler, fine powder of aluminum oxide or the like is used. These fine powder fillers are added not only to the coating solution of said phenol resin, but to the coating solution of epoxy resin, melamine resin, silicone resin, fluorine resin, polyimide resin, polyamidoimide resin, polyparabanic acid resin, and polyhydantoin resin to be described hereinafter, respectively, as the case demands. Additionally, in order to form a coating layer of a uniform thickness with good workability, the viscosity of coating solution is desirably adjusted to about 2 to about 100 cps by controlling the amount of solvent used.

As the aforesaid fluorine resin for forming the coating layer, trifluoroethylene, vinylidene fluoride, tetrafluoroethylene-hexafluoropropylene copolymer, perfluoroalkyl ether-tetrafluoroethylene copolymer, etc., are also used as well as tetrafluoroethylene. Further, fluorine resins modified with epoxy, phenol, polyamidoimide, polyimide, urethane, polyethersulfone or the like are also usable. These show excellent chemical resistance, electric insulation properties, moisture resistance, nontoxicity, peeling properties, abrasion resistance, nonadhesion properties, etc., but are difficult to be formed into film in themselves. In the present invention, however, the resin is used in a thin coating film form on a base substrate, and hence the above-described difficulty does not matter. The modified fluorine resin is easily adhered directly to base substrate 100 due to its low melting temperature, whereas the straight fluorine resin has such a poor adhesion that it is preferred to adhere the fluorine resin thin film to the base substrate with a primer therebetween. As solvents for the fluorine resin, almost the same solvents as have been mentioned with the aforesaid phenol resin are used. When the base substrate 100 is composed of a resin belonging to the second resin group poor in solvent resistance, the base substrate 100 would be attacked when a solvent such as a ketone is used. Therefore, in order to avoid this, the fluorine resin must be coated on the base substrate as an alcohol solution or an aqueous solution using the aforesaid alcohol or water. Base substrate 100 composed of a resin of the first resin group does not impose such limitation.

As the aforesaid silicone resin for forming a coating layer, straight type silicone resins and modified silicone resins modified with alkyd, epoxy, urethane, acryl, polyester or the like may be used. These are excellent in electric insulating properties, chemical resistance, humidity resistance, color-changing resistance at high temperatures, etc., and have good flexibility. Additionally, as solvents for them, those having been illustrated with respect to the above-described fluorine resins may be used.

As the aforesaid PPA for forming a coating layer, for example, products by TONEN Oil Chemical Co., Ltd. with trade names of XT-1 and XT-4 may be used.

They are homopolymers or copolymers containing fundamental units represented by the following general formula:

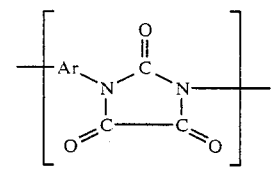

wherein Ar represents an arylene residue. As examples of the above-described Ar, there are:

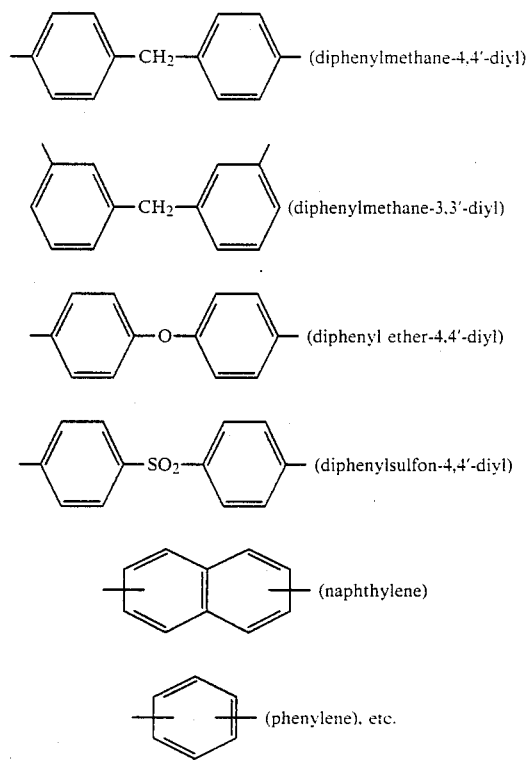

In using the above-described PPA, it is made into a varnish-like solution using N,N-dimethylformamide (DMF), N-methylpyrrolidone (NMP) or the like as a main solvent and a ketone solvent such as acetone, MEK, MIBK or the like as a diluent. PPA has an excellent heat resistance next to that of PI and can preferably be used as a coating agent for the functional film of the present invention.

As the aforesaid PI for forming a coating layer, a product produced, for example, by Kanebo NSC Co., Ltd. with the trade name of THERMID (IP-600) is preferably used. This PI is a polyisoimide oligomer having acetylene groups at both ends and is represented by the following structural formula:

trade name of RESISTHERM (AI 133L) and represented by the following structural formula is used:

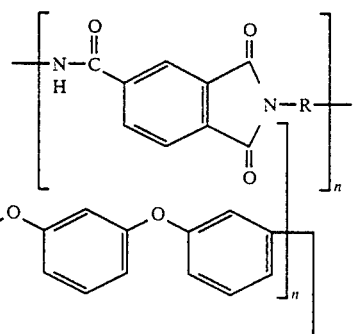

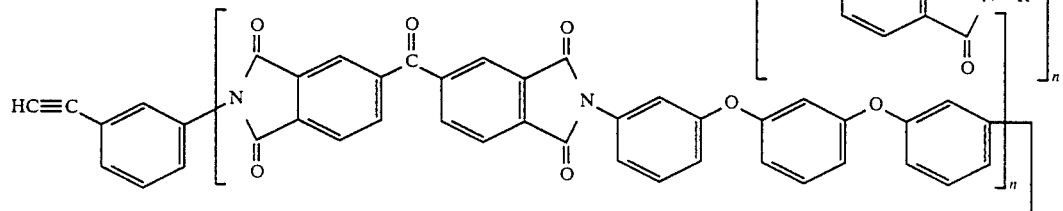

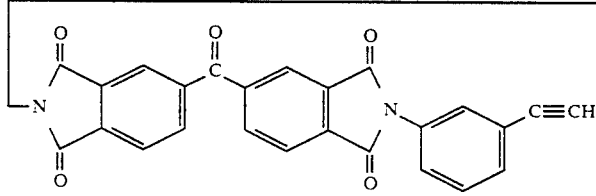

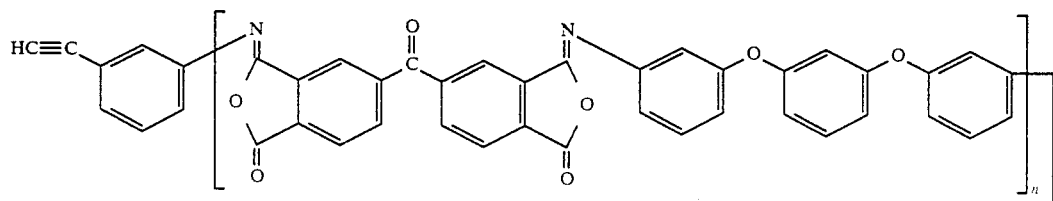

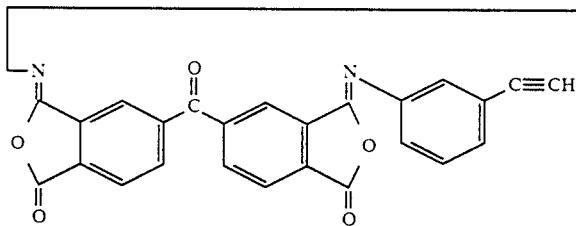

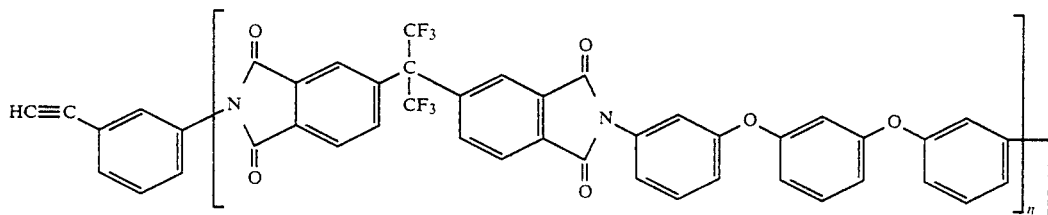

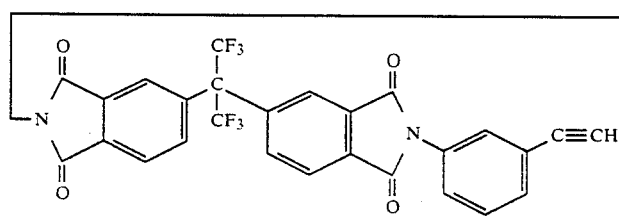

As solvents for this, DMF, NMP, etc., are used as main solvents, and ketone type solvents such as acetone, MEK, MIBK, etc., are used as diluents. As PI, thermosetting polyimide resins such as bis-maleimidetriazine resin (BT resin, BT-2170; made by Mitsubishi Gas Chemical Co., Inc.) may be used.

As the aforesaid PAI for forming a coating layer, a product produced, for example, by Bayer AG with the As solvents for this, NMP, DMAC (dimethylacetamide), etc., are used as main solvents and ketone type solvents such as acetone, MEK, MIBK, etc., are used as diluents.

As the aforesaid PH for forming a coating layer, a product produced by, for example, Sumitomo Bayer Urethane Co., Ltd. with the trade name of RESIS-THERM (PH 20) and represented by the following structural formula is used:

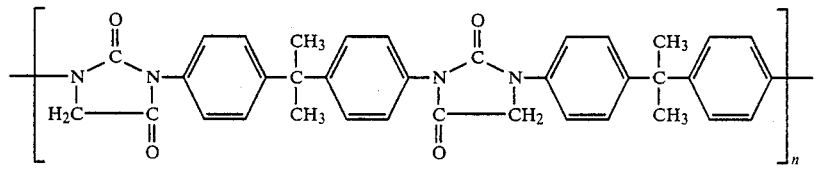

As solvents for this, cresol, phenol, etc., are used as main solvents and ketone solvents such as acetone, MEK, MIBK, etc., as diluents.

As the aforesaid epoxy resin and melamine resin for forming a coating layer, any of commercially available one may be used. In addition, modified ones and derivatives may also be used. When melamine resin is used as a coating layer, transparency can be kept high.

Additionally, as the thin film forming a coating layer, suitable one for the end-use of the film to be produced must, needless to say, be selected with considering the properties of the thin film.

Dry thickness of coating layer 200 is desirably in the range of from 1 to 10μ. Thickness of such degree is enough to provide sufficient heat resistance and fire retardance. It is not easy to form a coating layer having a thickness of less than 1μ from the standpoint of production technique and, even if such coating layer having a thickness of less than 1μ is formed, it is too thin to give satisfactory heat resistance and fire retardance. On the other hand, if the thickness exceeds 10μ, cracks or crazing or peeling of the coating film from base substrate is liable to take place upon bending, thus functional films suited for uses requiring excellent flexibility becoming difficult to obtain.

Baking temperature to be employed upon forming the coating layer 200 by baking the thin film is desirably within the range of from 130° to 300° C. As will be apparent from the experimental data to be described hereinafter, heat resistance or fire retardance of functional film is correlated with a baking temperature of the thin film and, as the baking temperature is raised, heat resistance or fire retardance tends to be improved. Therefore, a baking temperature of lower than 130° C. fails to provide functional films having sufficient heat resistance or fire retardance, whereas a baking temperature of higher than 300° C. causes bleeding from base substrate 100 and deteriorates other physical properties and, in addition, causes serious contraction or wrinkles, thus spoiling properties as film. However, a more preferable range of the baking temperature varies depending upon the kind of resin forming the base substrate 100, the kind of resin forming the coating layer 200, or the combination thereof, and will be described in more detail hereinafter.

A preferable example of the process of the present invention for producing the functional film is described below by reference to FIGS. 2 and 3.

Figure 2:
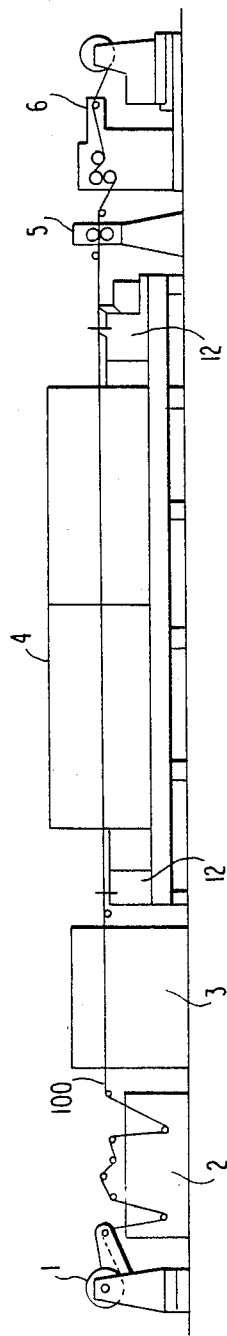
FIG. 2 is a flow sheet illustrating one embodiment of the process of the present invention for producing the film.

In FIG. 2, 1 designates a feeder of base substrate, 2 represents a dipping coater for coating solution, 3 represents a drying furnace, 4 represents a baking furnace, 5 represents a trimming apparatus, and 6 represents a winder. As is clear from FIG. 2, aforesaid base substrate 100 fed from the feeder 1 is passed through the dipping coater 2, during which thin film of the aforesaid coating solution is formed on one or both sides of the base substrate. As has been described hereinbefore, the thickness of this thin film is adjusted so that the dry thickness will be within the range of from 1 to 10μ. Additionally, primer treatment or corona discharge treatment of base substrate 100 to raise surface activity of the base substrate and to remove static electricity of foreign matter from base substrate 100 before introducing it into the dipping coater 2 is beneficial for raising adhesion properties of the coating layer, thus being preferable.

The thin film-formed base substrate 100 is then introduced into a drying furnace 3, during which the thin film is dried. Then, the base substrate 100 having the thus-dried thin film is then introduced into a baking furnace 4, during which the thin film is baked to form a coating layer. As has been described hereinbefore, the baking temperature is within the range of from 130° to 300° C. The baking temperature is adjusted to a suitable level in accordance with the kinds of base substrate 100 and thin film resin and the combination thereof. In addition, baking time is desirably about 0.5 to 5 minutes. What is important upon conducting this baking is to keep the base substrate 100 in a flatly form-retaining state without looseness. If baking of the thin film is conducted without keeping the base substrate 100 in a flatly form-retaining state, the base substrate 100 undergoes contraction or wrinkling since the baking temperature is comparatively high as described above, thus properties as film being spoiled. However, if a tension is positively applied to base substrate 100 to prevent looseness, the base substrate 100 is forcibly stretched, thus retention of its initial form becoming difficult. Therefore, in the present invention, an apparatus shown in FIGS. 3 and 4 is used to keep the base substrate 100 in a flatly form-retaining state with no looseness without positively applying tension thereto. That is, this apparatus comprises a left-and-right pair of endlessly rotating members 11, 11 each having a number of clipping mechanisms 10 shown in FIG. 4 linked thereto in an endless manner are set to mount 12 in such state that one end-to-one end or other end-to-other end space of respective rotating members are narrowing or broadening. As is shown in FIG. 4, in the above-described clipping mechanism 10, arm 16 is provided to bracket 14 provided to support 13 to permit the tip click 15 to move between the position of nipping the base substrate 100 and the position spaced from support 13 and near to the side of bracket 14, and spring 17 always pressing the click 15 to the above-described nipping position is provided between the arm 16 and the bracket 14. Periphery of rotary plate 18 for control provided to a contact roller of the endlessly rotating member 11 is faced to the upper end 19 of the abovedescribed arm 16 from its side.

Figure 3:
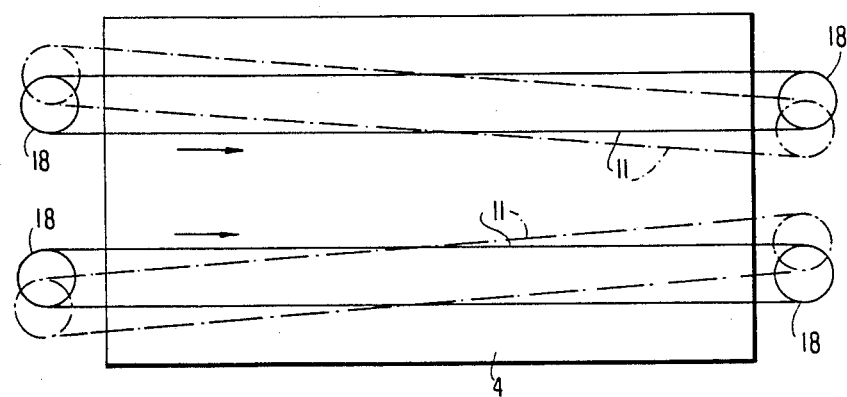
FIG. 3 is a schematic plan of an apparatus for keeping the base substrate in a form-retaining state.
Figure 4:
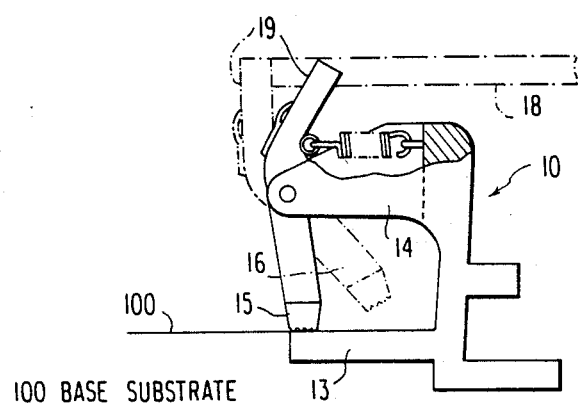
FIG. 4 is a partially cut schematic side view of a clipping mechanism.

In the apparatus of such structure, when endlessly rotating member 11 is rotated in the direction shown by the arrow in FIG. 3, arm 16 of the clipping mechanism 10 is swayed to the position shown by dotted line in FIG. 4 by the rotary plate 18 for control to detach click 15 from the support 13 in the position where the endlessly rotating member 11 turns, or arm 16 restores to the position shown by full line in FIG. 4 by the power of spring 17 to face click 15 to support 13 in other position. Therefore, when the base substrate 100 having formed thereon the above-described thin film is fed between a pair of the endlessly rotating members 11, 11, both ends of the base substrate are clipped by the clipping mechanism 10 at the entrance of the apparatus as shown by the full line in FIG. 4, and the base substrate travels to the exit of the apparatus in the as-clipped state, where the clipping is released. With base substrate 100 to be shrinked upon being heated (for example, base substrate composed of stretched PET or PPS), the space between a pair of the endlessly rotating members 11, 11 is gradually narrowed as the position nears the exit, whereas with base substrate 100 composed of non-stretched thermoplastic resin which elongates upon being heated, the above-described space is gradually broadened as the position nears the exit to thereby keep the base substrate 100 in a flatly form-retained state without application of a positive tension even if a tension is eventually applied to the base substrate 100 and without looseness during a period wherein the base substrate 100 is passed through the baking furnace 4. Additionally, FIG. 3 illustrates the case of feeding base substrate 100 which shrinks upon being heated by dotted line.

Since shrinking or wrinkling does not take place even at high baking temperatures when the thin film on the base substrate is baked with keeping the substrate in a flatly form-retained state, heat resistance, fire retardance, etc., can be improved without spoiling properties as film. Additionally, in order to enhance smoothness of film surface, film may be pressed upwards and downwards using drums.

The thus-obtained functional film is trimmed by means of a trimming apparatus 5, then wound around a winder 6.

Now, the functional films of the present invention are more specifically described in several groups.

The first group functional films are those wherein the base substrate 100 is composed of one of the aforesaid thermoplastic resins of PVC, PC, PAR, PET, PPS, PES, and PEI and the coating layer 200 is composed of the aforesaid phenol resin. Where the phenol resin constituting the coating layer 200 is a straight phenol resin or a modified phenol resin, the thickness of the base substrate 100 be within the range of from 1 to 1,000μ, and the thickness (dry) of the coating layer 200 be within the range of 1 to 10μ. The lower limit of the baking temperature is 130° C., but the upper limit somewhat varies depending upon the kind of the resin of base substrate 100. With PVC, the upper limit is about 250° C. and, with other resins of PC, PAR, PET, PSF, PEI, etc., it is about 300° C. Examples 1 and 2 with functional films belonging to the first group are given below.

EXAMPLE 1

Base substrates (all 50μ in thickness) composed respectively of PC (trade name: Macrofol; made by Bayer AG), PVC (trade name: Royphan; made by SANKO PLASTIC Co., Ltd.), PAR (trade name: EMBLATE; made by Unitika Co., Ltd.), PET (trade name: Ester; made by Toyobo Co., Ltd.) and PSF (trade name: TORAYSRON-PS; made by Toray Synthetic Film Co., Ltd.) were used. A thin film of phenol resin (trade name: MILEX; made by Mitsui Toatsu Chemicals Inc.) was formed on both sides of each substrate according to the process of the present invention by baking, based at varying temperatures as shown in Table 1 to prepare functional films having coating layers (all 3μ thick) on both sides. Characteristic properties of each film were examined according to the following testing methods to obtain the results shown in Table 1. For comparison, characteristic properties of nontreated films composed of respective substrate per se are also given in Table 1. Additionally, in Table 1, nontreated films for comparison are presented as "without coating layer", and functional films of the present invention as "with coating layer".

Testing Methods (1) Adhesion:

A coating layer is lattice-wise cut using a razor blade, a 24-mm wide cellophane tape is applied thereto, and the tape is rapidly delaminated to visually inspect delamination of the coating layer. o represents that almost no delamination is observed.

(2) Solvent Resistance:

A sample is dipped in each of acetone, MEK, toluene, and trichlene for 5 minutes at room temperature according to JIS C-6481 5.13. o represents a state of almost no delamination or dissolution, and x represents a state that delamination or dissolution of the coating layer is observed and that removal of the coating layer takes place when rubbed with cloth.

(3) Heat Resistance:

A film sample bonded to copper foil is cut into a 5×5 cm piece, then dipped into an oil bath or a solder bath of varying temperatures shown in Table 1 for 30 seconds.

(4) Fire Retardance:

This test is conducted according to UL-94 VTM.

TABLE 1

| Substrate | Coating Layer | Baking Temp. (°C.) | Adhesion | Heat Resistance (°C.) | Tensile Strength (kgf/cm²) MD | TD | Elongation MD (%) | TD (%) | Heat Contraction Ratio MD (%) | TD (%) | Fire Retardance | Solvent Resistance | Bleeding |
|---|---|---|---|---|---|---|---|---|---|---|---|---|---|
| PC | Without coating layer | — | — | 130 | 7.9 | 8.3 | 133.6 | 123.1 | 0.6 | 0.9 | Δ | x | x |
|  | With coating layer | 130 | o | 140 | 8.1 | 8.2 | 133.0 | 123.5 | 0.6 | 0.8 | o | o | o |
|  |  | 170 | o | 180 | 8.0 | 8.3 | 132.8 | 126.2 | 0.6 | 0.7 | o | o | o |
|  |  | 200 | o | 230 | 8.2 | 8.2 | 131.2 | 127.1 | 0.5 | 0.5 | o | o | o |
|  |  | 250 | o | 240 | 7.1 | 7.2 | 110.6 | 92.0 | 0.6 | 0.4 | o | o | o |
|  |  | 270 | o | 250 | 7.3 | 7.3 | 100.8 | 81.0 | 0.7 | 0.4 | o | o | o |
|  |  | 300 | o | 250 | 7.5 | 7.4 | 96.8 | 68 | 0.8 | 0.5 | o | o | o |

TABLE 1-continued

| Substrate | Coating Layer | Baking Temp. (°C.) | Adhesion | Heat Resistance (°C.) | Tensile Strength (kgf/cm²) MD | Tensile Strength (kgf/cm²) TD | Elongation MD (%) | Elongation TD (%) | Heat Contraction Ratio MD (%) | Heat Contraction Ratio TD (%) | Fire Retardance | Solvent Resistance | Bleeding |
|---|---|---|---|---|---|---|---|---|---|---|---|---|---|
| PVC | Without coating layer | — | — | 80 | 6.1 | 6.3 | 67.2 | 5.0 | 28.9 | −2.9 | o | x | x |
|  | With coating layer | 130 | o | 120 | 6.0 | 6.1 | 36.3 | 6.0 | 16.3 | −1.9 | o | o | o |
|  |  | 170 | o | 150 | 5.9 | 5.8 | 30.2 | 7.2 | 8.2 | 0.9 | o | o | o |
|  |  | 200 | o | 180 | 5.8 | 5.4 | 25.3 | 8.0 | 0.6 | 0.4 | o | o | o |
|  |  | 250 | o | 210 | 5.8 | 5.5 | 20.8 | 10.0 | 0.5 | 0.4 | o | o | o |
| PAR | Without coating layer | — | — | 170 | 7.1 | 6.7 | 76.7 | 42.1 | 0.0 | 0.2 | o | x | x |
|  | With coating layer | 130 | o | 170 | 7.1 | 6.7 | 70.3 | 40.8 | 0.0 | 0.2 | o | o | o |
|  |  | 170 | o | 180 | 7.1 | 6.8 | 48.3 | 40.0 | 0.1 | 0.1 | o | o | o |
|  |  | 200 | o | 240 | 7.2 | 7.2 | 43.9 | 39.9 | −0.2 | 0.0 | o | o | o |
|  |  | 250 | o | 255 | 7.3 | 7.2 | 41.3 | 39.6 | 0.2 | 0.1 | o | o | o |
|  |  | 300 | o | 260 | 7.4 | 7.2 | 35.8 | 35.7 | 0.2 | 0.2 | o | o | o |
| PET | Without coating layer | — | — | 210 | 20.5 | 25.0 | 84.5 | 80.1 | 1.6 | 0.2 | x | o | x |
|  | With coating layer | 130 | o | 220 | 20.7 | 25.1 | 81.3 | 80.2 | 1.3 | 0.2 | o | o | o |
|  |  | 200 | o | 230 | 21.6 | 25.2 | 82.5 | 61.7 | 0.8 | 0.0 | o | o | o |
|  |  | 250 | o | 240 | 18.7 | 22.4 | 89.7 | 83.9 | 1.0 | 0.6 | o | o | o |
|  |  | 270 | o | 250 | 17.0 | 19.1 | 68.7 | 85.4 | 1.0 | 0.7 | o | o | o |
|  |  | 300 | o | 250 | 13.3 | 17.0 | 49.7 | 89.5 | 0.9 | 0.9 | o | o | o |
| PSF | Without coating layer | — | — | 150 | 7.4 | 6.9 | 140.0 | 120.0 | 0.3 | 0.2 | Δ | x | x |
|  | With coating layer | 130 | o | 150 | 7.4 | 6.9 | 140.2 | 120.3 | 0.3 | 0.2 | o | o | o |
|  |  | 170 | o | 180 | 7.2 | 6.7 | 133.2 | 119.2 | 0.2 | 0.1 | o | o | o |
|  |  | 200 | o | 210 | 7.0 | 6.8 | 128.4 | 116.3 | 0.1 | 0.1 | o | o | o |
|  |  | 250 | o | 240 | 7.1 | 6.7 | 113.6 | 108.4 | 0.1 | 0.1 | o | o | o |
|  |  | 270 | o | 250 | 6.9 | 6.5 | 109.3 | 103.8 | 0.1 | 0.1 | o | o | o |
|  |  | 300 | o | 250 | 6.8 | 6.6 | 103.5 | 98.7 | 0.1 | 0.1 | o | o | o |

It is seen from Table 1 that heat resistance of the functional films of the present invention is markedly improved in comparison with nontreated films, and more improved heat resistance is obtained by employing higher baking temperature for baking the thin film, and that fire retardance, adhesion between base substrate and coating layer, solvent resistance, etc., are generally at good levels with each film. With heat resistance of functional film containing inexpensive and easily available PVC as base substrate, the sample baked at a low limit of baking temperature, 130° C., showed an improvement by as much as about 40° C. in comparison with non-treated PVC film. Heat resistance of the functional film containing PVC as base substrate and produced at a baking temperature of 130° C. is approximate to that of nontreated film containing PC as base substrate. Heat resistance of the functional film containing PVC as base substrate and produced at a baking temperature of 250° C. is much better than that of nontreated film containing PC or PAR as base substrate, and is approximate to that of non-treated film containing PET as base substrate. It can be said, from the above results, that the functional film containing PVC as base substrate shows so much improved heat resistance properties in comparison with corresponding nontreated film that it can be used in place of nontreated film containing PET as base substrate. Similar grade-up tendency appears with the functional films containing PC, PAR or PET as base substrate. Therefore, it is apparent that these functional films find broader applications than corresponding nontreated films. For example, heat resistance of the functional films baked at a baking temperature of 300° C. is enough to substitute for films containing engineering plastics as base substrate described at the top of this specification. In addition, it has recently been tried to apply films containing thermoplastic resin as base substrate to the field of electronics including base films for flexible printed circuit base films (FPC), condensers, transparent electrodes, etc., films for liquid crystal, IC carrier tapes, field of interior materials for aircraft and automobiles, field of atomic power industry, etc., utilizing flexibility of the film. For example, in the case of using as base film for FPC, enough heat resistance and fire retardance to resist a temperature of about 250° C., a temperature of solder, to which the film is to be exposed upon soldering is demanded. It is apparent from Table 1 that, as a film satisfying this requirement, the functional film containing PAR as base substitute having been baked at 250° C. or more and the functional film containing PC or PET as base substitute having been baked at 270° C. or more can be used. These films enable to apply FPC to a curved surface utilizing their flexibility. Interior materials for aircraft and automobiles particularly require fire retardance, and all functional films in Table 1 are found to meet this requirement.

EXAMPLE 2

Functional films (Samples 1 and 2 of the present invention) having a coating layer on one side of a base substrate and functional films (Samples 3 and 4 of the present invention) having a coating layer on both sides were prepared by using as a base substrate a PET film (trade name: Ester; made by Toyobo Co., Ltd.) or a PAR film (trade name: EMBLATE; made by Unitika Co., Ltd.), forming a thin film of phenol resin (trade name: MILEX; made by Mitsui Toatsu Chemicals Inc.) on the base substrate according to the process of the present invention, then baking at a temperature shown in Table 2. Characteristic properties of each film were examined according to the following testing methods to obtain the results shown in Table 3. For comparison, characteristics of nontreated PET film, nontreated PAR film, a commercially available product produced by company A, a commercially available product produced by company B, and Teijin PNB-2 are also shown in Table 3. Additionally, the commercially available product produced by company A is a film prepared by adding Br and P compounds to a melamine/polyester mixture resin, the commercially available product produced by company B is a film prepared by adding a phosphorus-nitrogen compound to an epoxy resin, and Teijin PNB-2 is a film prepared by adding vinyl chloride-vinyl acetate copolymer solution to a mixture of methyl ethyl ketone:ethyl acetate:toluene (1:1:1), adding thereto tetrabromobisphenol A as fire retardant and dibutyl phosphate as a hardening catalyst, then mixing with butyl ether-modified melamine resin.

Further, adaptability of the functional films of the present invention as FPC or insulating film are examined to obtain the results shown in Table 4. In Table 4, one side-treated samples are samples prepared by forming a coating layer on one side of a base substrate, and forming a conductive pattern on the coating layer using a copper foil. nontreated PET means a commercially available FPC containing PET as base substrate, and polyimide means a commercially available FPC containing polyimide as base substrate. Additionally, tests on the characteristics shown in Tables 3 and 4 were conducted according to the following methods.

Testing Methods (1) Optical Characteristics:
According to JIS K-7015
(2) Adhesion and Fire Retardance:
Same as in Example 1
(3) Solvent Resistance and Chemical Resistance:
Same as the solvent resistance test in Example 1. Δ represents a state that delamination and dissolution of the coating layer are observed and, when rubbed by a cloth, the coating layer is partly removed. o and x each represents the same state as in Example 1.
(4) Etching Resistance:
A sample is dipped in a 10% aqueous solution of $FeCl_3$ (ferric chloride) at 40° C. for 10 minutes, washed with water, and dipped in a 5% aqueous solution of NaOH at 20° C. for 15 minutes, followed by washing with water. o represents a state that almost no delamination of coating layer is observed, and x represents a state that delamination of the coating layer is serious.
(5) Bending Resistance:
Tested according to JIS P-8115. o represents a state that the coating layer is scarcely delaminated by 200 time repeated bending, and x represents a state that the coating layer is seriously delaminated by 200 time repeated bending.
(6) Heat Resistance in Soldering:
Copper foil-laminated film is cut into a 5×5 cm piece, then dipped in a 230° C. soldering bath for 30 seconds. o represents a state that no melt contraction takes place, and x represents a state that melt contraction or delamination of the coating layer takes place.
(7) Adhesion to Copper Foil:
A peel strength at 180° is measured according to JIS C-6481 5.7. o represents that the peel strength at 10 mm width is 1 kg/cm² or more, Δ represents that the peel strength at 10 mm width is 500 g to 1 kg/cm², and x represents that the peel strength at 10 mmm width is less than 500 g/cm².
(8) Water Absorption Ratio
Measured according to JIS C-6481 (5.14). Water absorption ratios are measured after dipping samples in water for 24 hours.

TABLE 2

| | Samples of the Present Invention | | | |
|---|---|---|---|---|
| | Sample 1 | Sample 2 | Sample 3 | Sample 4 |
| Kind of Substrate | PET Film | PET Film | PET Film | PAR Film |
| Thickness of Substrate ($\mu$) | 100 | 100 | 75 | 100 |
| Thickness (dry) of Coating Layer ($\mu$) | 2 | 4 | 3 | 3 |
| Baking Temperature (°C.) | 200 | 200 | 220 | 220 |

TABLE 3

| | Present Invention | | | | Non-Treated PET | Non-Treated PET | Non-Treated PAR | Product by Company A (commercially available) | Product of Company B (commercially available) | Teijin PNB-2 |
|---|---|---|---|---|---|---|---|---|---|---|
| | Sample 1 | Sample 2 | Sample 3 | Sample 4 | | | | | | |
| Thickness (μm) | 102 | 104 | 81 | 106 | 100 | 75 | 100 | 110 | 125 | 112 |
| Optical Properties haze, % (JIS K-7105) | 7.0 | 10.7 | 7.3 | 3.7 | 9.3 | 4.1 | 5.7 | 4.9 | 49.8 | 16.4 |
| Adhesion of Coating Film (pressure-sensitive peel test) | ○ | ○ | ○ | ○ | — | — | — | — | — | — |
| Heat Contraction (%) | | | | | | | | | | |
| MD | 0.5 | 0.5 | 0.3 | 0 | 2.4 | 1.1 | 0 | 1.2 | 1.1 | 1.4 |
| TD | 0.4 | 0.4 | 0.2 | 0 | 0.7 | 0.5 | 0.3 | 0.5 | 0.2 | 1.7 |
| | (150° C., 0.5 hr) | (150° C., 0.5 hr) | | (150° C., 0.5 hr) | | | | | | |
| Fire Retardance, UL-94 | V-2 | V-2 | V-0 | V-0 | × | × | V-0 | HB | HB | HB |
| Tensile Strength (kg/mm$^2$) | | | | | | | | | | |
| MD | 20.3 | 20.0 | 20.3 | 6.8 | 21.5 | 18.8 | 6.3 | 12.0 | 18.4 | 20.4 |
| TD | 19.5 | 19.3 | 17.7 | 6.6 | 21.0 | 17.3 | 6.3 | 12.0 | 17.8 | 20.8 |
| Electric Properties | | | | | | | | | | |
| Volume Intrinsic Resistance (Ω·cm) | $5.2 \times 10^{16}$ | $5.6 \times 10^{16}$ | $3.6 \times 10^{16}$ | $4.8 \times 10^{16}$ | $1.4 \times 10^{15}$ | $8.2 \times 10^{16}$ | $6.6 \times 10^{16}$ | $5.4 \times 10^{16}$ | $5.7 \times 10^{16}$ | $4.9 \times 10^{14}$ |
| Dielectric Breakdown Voltage (kv/mm) | 195 | 203 | 164 | 206 | 175 | 129 | 207 | 130 | 164 | 183 |
| Dielectric Constant (1 KHz) | 3.4 | 3.4 | 3.2 | 3.4 | 3.4 | 3.2 | 3.3 | 3.7 | 3.6 | 3.8 |
| Dielectric Loss Tangent (1 KHz) | $0.52 \times 10^{-2}$ | $0.5 \times 10^{-2}$ | $0.85 \times 10^{-2}$ | $0.65 \times 10^{-2}$ | $0.46 \times 10^{-2}$ | $0.6 \times 10^{-2}$ | $0.6 \times 10^{-2}$ | $0.62 \times 10^{-2}$ | $0.64 \times 10^{-2}$ | $0.52 \times 10^{-2}$ |
| Chemical Resistance | | | | | | | | | | |
| Toluene | ○ | ○ | ○ | ○ | ○ | ○ | × | ○ | ○ | ○ |
| MEK | ○ | ○ | ○ | ○ | ○ | ○ | △ | ○ | ○ | ○ |
| Ethyl Acetate | ○ | ○ | ○ | ○ | ○ | ○ | ○ | ○ | ○ | ○ |

TABLE 4

|  | One-Side-Treated Sample According to the Invention (PET base) | Non-Treated Sample PET | Both-Side-Treated Sample According to the Invention (PET base) | Polyimide |
| --- | --- | --- | --- | --- |
| Thickness of Film ($\mu$)/ Copper Foil ($\mu$) | 79/35 | 75/35 | 31/35 | 25/35 |
| Solvent Resistance | o | o | o | o |
| Etching Resistance | o | o | o | o |
| Bending Resistance | o | o | o | o |
| Heat Resistance in Soldering | o | x | o | o |
| Adhesion to Copper Foil | o | o | Δ | x |
| Water Absorption Ratio (%) | 0.19 | 0.13 | 0.25 | 1.78 |
| Fire Retardance | V-0 | x | V-0 | V-0 |

It is seen from Table 3 that samples of the present invention show good optical properties (haze: not more than 10%) except for Sample 2 of the present invention, which are not so inferior to commercially available coated films in fire retardance, and yet show better adhesion and less heat contraction ratio than those of commercially available films. In addition, it is also seen that the films of the present invention show larger tensile strength than nontreated films, and show the same various electric properties as those of nontreated films or better than that, with having sufficient fire retardance or chemical resistance. It is seen from Table 4 that samples of the present invention are much superior to the commercially available FPC containing polyimide as base substrate in water absorption ratio and, from Tables 2 and 4, that they are superior to the nontreated samples (containing PET as base substrate) in heat resistance and fire retardance.

The second group films of the present invention are functional films wherein base substrate 100 is composed of one of the aforesaid first resin group (PET, PPS, PSF, PES, and PEI), and coating layer 200 is composed of one, two or more resins selected from among PI, PAI, PPA, and PH, or of a mixture of the resin and one, two or more resins selected from among a phenol resin, an epoxy resin, and a melamine resin. With this second group films, the thickness of base substrate 100 be within the scope of 1 to 350$\mu$, and that of coating layer (dry) be 1 to 10$\mu$, from the standpoint of handling properties, strength, degree of freedom of design, etc. Baking temperature be preferably selected from between 200° and 300° C. from the standpoint of heat resistance, adhesion between base substrate and coating layer, bleeding from base substrate, etc. When the coating layer is formed by mixing PAI and an epoxy resin, the coating layer shows improved adhesion to the base substrate and improved chemical resistance and properties of not absorbing water. A mixture of PI and an epoxy resin permits to reduce the molding temperature. Further, when the coating layer is formed by a melamine resin, heat resistance is advantageously improved. Example 3 with functional films belonging to the second group films are shown below.

EXAMPLE 3

Eight kinds of functional films (Samples 5 to 12 of the present invention) of the structure shown in Table 5 were prepared according to the process of the present invention, and characteristic properties of them were examined with changing the baking temperature. The results are shown in Tables 6 to 13. For comparison, characteristic properties of nontreated films (Comparative Samples 1 to 3) containing PET, PPA, and PI, respectively, as base substrate and having no coating layer are shown in Table 14. Additionally, methods for testing the characteristic properties are conducted in the same manner as in Example 1.

TABLE 5

|  | Kind of Substrate | Thickness of Substrate ($\mu$) | Kind and Compounding Ratio of Coating Layer | Thickness of Coating Layer ($\mu$) | Coating Layer-Formed Position |
| --- | --- | --- | --- | --- | --- |
| Sample 5 of the Invention | PET | 25 | PPA (alone) | Dry: 3/3 | Both sides |
| Sample 6 of the Invention | PET | 25 | PI (alone) | Dry: 3/3 | Both sides |
| Sample 7 of the Invention | PET | 25 | PAI (alone) | Dry: 3/3 | Both sides |
| Sample 8 of the Invention | PET | 25 | PPA/PAI = 5/5 | Dry: 3/3 | Both sides |
| Sample 9 of the Invention | PET | 25 | PPA/Phenol = 5/5 | Dry: 3/3 | Both sides |
| Sample 10 of the Invention | PET | 25 | PAI/Phenol = 5/5 | Dry: 3/3 | Both sides |
| Sample 11 of the Invention | PET | 25 | Phenol/PAI/PPA = 4/3/3 | Dry: 3/3 | Both sides |
| Sample 12 of the Invention | PSF | 25 | PPA (alone) | Dry: 3/3 | Both sides |

In Table 5, MILEX XL-209 (50% concentration; ethyl cellosolve was used as solvent) was used as phenol (made by Mitsui Toatsu Chemicals Inc.), polyparabanic acid PPA (powder) was used as PPA (made by TONEN Oil Chemical Co., Ltd.), RESISTHERM AI-133L (33% concentration; NMP/DMAC=4/3 was used as solvent) was used as PAI (made by Bayer AG)

and THERMID IP-600 (powder) was used as PI (made by Kanebo NSC CO., Ltd.).

TABLE 6

(Sample 5 of the Invention)

| Baking Time (min) | Baking Temp. (°C.) | Adhesion | Heat Resistance (°C.) | Tensile Strength (kgf/cm$^2$) MD | TD | Heat Contraction Ratio MD (%) | TD (%) | Water Absorption Ratio (%) | Fire Retardance UL-94 |
|---|---|---|---|---|---|---|---|---|---|
| 5 | 195 | x | 220 | 20.3 | 21.5 | 0.9 | 0.8 | 0.36 | V-0 |
| 5 | 200 | Δ | 230 | 19.6 | 20.3 | 0.6 | 0.5 | 0.36 | V-0 |
| 5 | 230 | o | 230 | 18.8 | 19.2 | 0.4 | 0.4 | 0.36 | V-0 |
| 4 | 250 | o | 240 | 16.4 | 15.8 | 0.3 | 0.1 | 0.36 | V-0 |
| 3 | 270 | o | 250 | 13.2 | 12.8 | 0.2 | 0.2 | 0.36 | V-0 |
| 2 | 300 | o | 250 | 10.2 | 10.3 | 0.1 | 0.2 | 0.36 | V-0 |
| 2 | 305 | o | 250 | 6.4 | 4.6 | 0.2 | 0.1 | 0.36 | V-0 |

| Electric Properties | | | | | | |
|---|---|---|---|---|---|---|
| Volume Intrinsic Resistance | Insulation Breakdown Voltage | Dielectric Constant | Dielectric Loss Tangent | Solvent Resistance | Alkali Resistance | Hue |
| $5 \times 10^{16}$ | 250 | 3.4 | $4 \times 10^{-3}$ | o | Δ | |
| $5 \times 10^{16}$ | 250 | 3.4 | $4 \times 10^{-3}$ | o | Δ | |
| $5 \times 10^{16}$ | 250 | 3.4 | $4 \times 10^{-3}$ | o | Δ | |
| $5 \times 10^{16}$ | 250 | 3.4 | $4 \times 10^{-3}$ | o | Δ | Colorless and transparent |
| $5 \times 10^{16}$ | 250 | 3.4 | $4 \times 10^{-3}$ | o | Δ | |
| $5 \times 10^{16}$ | 250 | 3.4 | $4 \times 10^{-3}$ | o | Δ | |
| $5 \times 10^{16}$ | 250 | 3.4 | $4 \times 10^{-3}$ | o | Δ | |

TABLE 7

(Sample 6 of the Invention)

| Baking Time (min) | Baking Temp. (°C.) | Adhesion | Heat Resistance (°C.) | Tensile Strength (kgf/cm$^2$) MD | TD | Heat Contraction Ratio MD (%) | TD (%) | Water Absorption Ratio (%) | Fire Retardance UL-94 |
|---|---|---|---|---|---|---|---|---|---|
| 5 | 195 | x | 220 | 19.0 | 19.3 | 0.9 | 0.8 | 0.44 | V-0 |
| 5 | 200 | Δ | 230 | 18.8 | 17.5 | 0.6 | 0.5 | 0.44 | V-0 |
| 5 | 230 | o | 230 | 18.9 | 17.0 | 0.4 | 0.5 | 0.44 | V-0 |
| 4 | 250 | o | 240 | 17.8 | 16.8 | 0.2 | 0.2 | 0.44 | V-0 |
| 3 | 270 | o | 250 | 13.8 | 14.3 | 0.1 | 0.2 | 0.44 | V-0 |
| 2 | 300 | o | 250 | 10.2 | 10.6 | 0.2 | 0.1 | 0.44 | V-0 |
| 2 | 305 | o | 250 | 5.2 | 5.4 | 0.2 | 0.1 | 0.44 | V-0 |

| Electric Properties | | | | | | |
|---|---|---|---|---|---|---|
| Volume Intrinsic Resistance | Insulation Breakdown Voltage | Dielectric Constant | Dielectric Loss Tangent | Solvent Resistance | Alkali Resistance | Hue |
| $3 \times 10^{17}$ | 265 | 3.4 | $3 \times 10^{-3}$ | o | o | |
| $3 \times 10^{17}$ | 265 | 3.4 | $3 \times 10^{-3}$ | o | o | |
| $3 \times 10^{17}$ | 265 | 3.4 | $3 \times 10^{-3}$ | o | o | |
| $3 \times 10^{17}$ | 265 | 3.4 | $3 \times 10^{-3}$ | o | o | Yellow and transparent |
| $3 \times 10^{17}$ | 265 | 3.4 | $3 \times 10^{-3}$ | o | o | |
| $3 \times 10^{17}$ | 265 | 3.4 | $3 \times 10^{-3}$ | o | o | |
| $3 \times 10^{17}$ | 265 | 3.4 | $3 \times 10^{-3}$ | o | o | |

TABLE 8

(Sample 7 of the Invention)

| Baking Time (min) | Baking Temp. (°C.) | Adhesion | Heat Resistance (°C.) | Tensile Strength (kgf/cm$^2$) MD | TD | Heat Contraction Ratio MD (%) | TD (%) | Water Absorption Ratio (%) | Fire Retardance UL-94 |
|---|---|---|---|---|---|---|---|---|---|
| 5 | 195 | x | 220 | 17.5 | 20.0 | 0.8 | 0.9 | 0.66 | V-0 |
| 5 | 200 | Δ | 230 | 18.2 | 21.3 | 0.6 | 0.4 | 0.66 | V-0 |
| 5 | 230 | o | 230 | 18.8 | 19.6 | 0.5 | 0.4 | 0.66 | V-0 |
| 4 | 250 | o | 240 | 16.5 | 17.2 | 0.3 | 0.2 | 0.66 | V-0 |
| 3 | 270 | o | 250 | 14.3 | 15.2 | 0.2 | 0.1 | 0.66 | V-0 |
| 2 | 300 | o | 250 | 10.6 | 10.8 | 0.1 | 0.1 | 0.66 | V-0 |
| 2 | 305 | o | 250 | 4.8 | 4.1 | 0.1 | 0.2 | 0.66 | V-0 |

Electric Properties

Volume    Insulation             Dielectric

TABLE 8-continued (Sample 7 of the Invention)

| Intrinsic Resistance | Breakdown Voltage | Dielectric Constant | Loss Tangent | Solvent Resistance | Alkali Resistance | Hue |
|---|---|---|---|---|---|---|
| $2 \times 10^{16}$ | 240 | 3.4 | $6 \times 10^{-3}$ | o | o | |
| $2 \times 10^{16}$ | 240 | 3.4 | $6 \times 10^{-3}$ | o | o | |
| $2 \times 10^{16}$ | 240 | 3.4 | $6 \times 10^{-3}$ | o | o | |
| $2 \times 10^{16}$ | 240 | 3.4 | $6 \times 10^{-3}$ | o | o | Yellow and |
| $2 \times 10^{16}$ | 240 | 3.4 | $6 \times 10^{-3}$ | o | o | transparent |
| $2 \times 10^{16}$ | 240 | 3.4 | $6 \times 10^{-3}$ | o | o | |
| $2 \times 10^{16}$ | 240 | 3.4 | $6 \times 10^{-3}$ | o | o | |

TABLE 9

(Sample 8 of the Invention)

| Baking Time (min) | Baking Temp. (°C.) | Adhesion | Heat Resistance (°C.) | Tensile Strength (kgf/cm²) MD | Tensile Strength (kgf/cm²) TD | Heat Contraction Ratio MD (%) | Heat Contraction Ratio TD (%) | Water Absorption Ratio (%) | Fire Retardance UL-94 |
|---|---|---|---|---|---|---|---|---|---|
| 5 | 195 | x | 220 | 18.8 | 20.2 | 0.8 | 0.8 | 0.42 | V-0 |
| 5 | 200 | Δ | 230 | 18.4 | 19.3 | 0.6 | 0.8 | 0.42 | V-0 |
| 3 | 270 | o | 250 | 13.6 | 12.8 | 0.2 | 0.2 | 0.42 | V-0 |
| 2 | 300 | o | 250 | 11.3 | 10.2 | 0.2 | 0.1 | 0.42 | V-0 |
| 2 | 305 | o | 250 | 4.2 | 6.8 | 0.2 | 0.1 | 0.42 | V-0 |

| Electric Properties | | | | | | |
|---|---|---|---|---|---|---|
| Volume Intrinsic Resistance | Insulation Breakdown Voltage | Dielectric Constant | Dielectric Loss Tangent | Solvent Resistance | Alkali Resistance | Hue |
| $4 \times 10^{16}$ | 242 | 3.4 | $5 \times 10^{-3}$ | o | Δ | |
| $4 \times 10^{16}$ | 242 | 3.4 | $5 \times 10^{-3}$ | o | Δ | |
| $4 \times 10^{16}$ | 242 | 3.4 | $5 \times 10^{-3}$ | o | Δ | Yellow and |
| $4 \times 10^{16}$ | 242 | 3.4 | $5 \times 10^{-3}$ | o | Δ | transparent |
| $4 \times 10^{16}$ | 242 | 3.4 | $5 \times 10^{-3}$ | o | Δ | |

TABLE 10

(Sample 9 of the Invention)

| Baking Time (min) | Baking Temp. (°C.) | Adhesion | Heat Resistance (°C.) | Tensile Strength (kgf/cm²) MD | Tensile Strength (kgf/cm²) TD | Heat Contraction Ratio MD (%) | Heat Contraction Ratio TD (%) | Water Absorption Ratio (%) | Fire Retardance UL-94 |
|---|---|---|---|---|---|---|---|---|---|
| 5 | 195 | Δ | 220 | 20.6 | 21.3 | 0.9 | 0.9 | 0.33 | V-0 |
| 5 | 200 | Δ | 230 | 19.8 | 20.8 | 0.6 | 0.5 | 0.33 | V-0 |
| 3 | 270 | o | 250 | 13.8 | 12.6 | 0.2 | 0.2 | 0.33 | V-0 |
| 2 | 300 | o | 250 | 8.6 | 9.2 | 0.2 | 0.1 | 0.33 | V-0 |
| 2 | 305 | | | Impossible to mold | | | | | |

| Electric Properties | | | | | | |
|---|---|---|---|---|---|---|
| Volume Intrinsic Resistance | Insulation Breakdown Voltage | Dielectric Constant | Dielectric Loss Tangent | Solvent Resistance | Alkali Resistance | Hue |
| $4 \times 10^{16}$ | 218 | 3.4 | $5 \times 10^{-3}$ | o | o | |
| $4 \times 10^{16}$ | 218 | 3.4 | $5 \times 10^{-3}$ | o | o | Brown and |
| $4 \times 10^{16}$ | 218 | 3.4 | $5 \times 10^{-3}$ | o | o | opaque |
| $4 \times 10^{16}$ | 218 | 3.4 | $5 \times 10^{-3}$ | o | o | |
| Impossible to mold | | | | | | |

TABLE 11

(Sample 10 of the Invention)

| Baking Time (min) | Baking Temp. (°C.) | Adhesion | Heat Resistance (°C.) | Tensile Strength (kgf/cm²) MD | Tensile Strength (kgf/cm²) TD | Heat Contraction Ratio MD (%) | Heat Contraction Ratio TD (%) | Water Absorption Ratio (%) | Fire Retardance UL-94 |
|---|---|---|---|---|---|---|---|---|---|
| 5 | 195 | Δ | 220 | 20.0 | 20.8 | 0.9 | 0.8 | 0.47 | V-0 |
| 5 | 200 | Δ | 230 | 19.6 | 20.6 | 0.5 | 0.3 | 0.47 | V-0 |
| 3 | 270 | o | 250 | 14.6 | 15.2 | 0.1 | 0.2 | 0.47 | V-0 |
| 2 | 300 | o | 250 | 9.8 | 8.7 | 0.2 | 0.2 | 0.47 | V-0 |
| 2 | 305 | | | Impossible to mold | | | | | |

Electric Properties

TABLE 11-continued (Sample 10 of the Invention)

| Volume Intrinsic Resistance | Insulation Breakdown Voltage | Dielectric Constant | Dielectric Loss Tangent | Solvent Resistance | Alkali Resistance | Hue |
|---|---|---|---|---|---|---|
| $3 \times 10^{16}$ | 200 | 3.4 | $6 \times 10^{-3}$ | o | o | |
| $3 \times 10^{16}$ | 200 | 3.4 | $6 \times 10^{-3}$ | o | o | Brown and |
| $3 \times 10^{16}$ | 200 | 3.4 | $6 \times 10^{-3}$ | o | o | opaque |
| $3 \times 10^{16}$ | 200 | 3.4 | $6 \times 10^{-3}$ | o | o | |
| | | | Impossible to mold | | | |

TABLE 12

(Sample 11 of the Invention)

| Baking Time (min) | Baking Temp. (°C.) | Adhesion | Heat Resistance (°C.) | Tensile Strength (kgf/cm²) MD | TD | Heat Contraction Ratio MD (%) | TD (%) | Water Absorption Ratio (%) | Fire Retardance UL-94 |
|---|---|---|---|---|---|---|---|---|---|
| 5 | 195 | Δ | 220 | 19.3 | 20.1 | 0.8 | 0.7 | 0.38 | V-0 |
| 5 | 200 | Δ | 230 | 18.4 | 18.8 | 0.6 | 0.3 | 0.38 | V-0 |
| 3 | 270 | o | 250 | 12.8 | 13.5 | 0.1 | 0.2 | 0.38 | V-0 |
| 2 | 300 | o | 250 | 10.2 | 9.8 | 0.1 | 0.2 | 0.38 | V-0 |
| 2 | 305 | | | Impossible to mold | | | | | |

| | Electric Properties | | | | | |
|---|---|---|---|---|---|---|
| Volume Intrinsic Resistance | Insulation Breakdown Voltage | Dielectric Constant | Dielectric Loss Tangent | Solvent Resistance | Alkali Resistance | Hue |
| $4 \times 10^{16}$ | 213 | 3.4 | $5 \times 10^{-3}$ | o | o | |
| $4 \times 10^{16}$ | 213 | 3.4 | $5 \times 10^{-3}$ | o | o | Brown and |
| $4 \times 10^{16}$ | 213 | 3.4 | $5 \times 10^{-3}$ | o | o | opaque |
| $4 \times 10^{16}$ | 213 | 3.4 | $5 \times 10^{-3}$ | o | o | |
| | | | Impossible to mold | | | |

TABLE 13

(Sample 12 of the Invention)

| Baking Time (min) | Baking Temp. (°C.) | Adhesion | Heat Resistance (°C.) | Tensile Strength (kgf/cm²) MD | TD | Heat Contraction Ratio MD (%) | TD (%) | Water Absorption Ratio (%) | Fire Retardance UL-94 |
|---|---|---|---|---|---|---|---|---|---|
| 5 | 195 | x | 200 | 7.0 | 6.9 | 0.2 | 0.1 | 0.38 | V-0 |
| 5 | 200 | Δ | 210 | 6.9 | 6.8 | 0.1 | 0.1 | 0.38 | V-0 |
| 3 | 270 | o | 260 | 6.5 | 6.6 | 0.1 | 0.1 | 0.38 | V-0 |
| 2 | 300 | o | 260 | 6.4 | 6.5 | 0.1 | 0.1 | 0.38 | V-0 |
| 2 | 305 | o | 260 | 4.4 | 4.2 | 0.1 | 0.1 | 0.38 | V-0 |

| | Electric Properties | | | | | |
|---|---|---|---|---|---|---|
| Volume Intrinsic Resistance | Insulation Breakdown Voltage | Dielectric Constant | Dielectric Loss Tangent | Solvent Resistance | Alkali Resistance | Hue |
| $4 \times 10^{16}$ | 230 | 3.5 | $4.6 \times 10^{-3}$ | o | Δ | |
| $4 \times 10^{16}$ | 230 | 3.5 | $4.6 \times 10^{-3}$ | o | Δ | |
| $4 \times 10^{16}$ | 230 | 3.5 | $4.6 \times 10^{-3}$ | o | Δ | Colorless and |
| $4 \times 10^{16}$ | 230 | 3.5 | $4.6 \times 10^{-3}$ | o | Δ | transparent |
| $4 \times 10^{16}$ | 230 | 3.5 | $4.6 \times 10^{-3}$ | o | Δ | |

TABLE 14

(Comparative Samples 1 to 3)

| | Heat Resistance (°C.) | Tensile Strength (kgf/cm²) MD | TD | Heat Contraction Ratio MD (%) | TD (%) | Water Absorption Ratio (%) | Fire Retardance UL-94 |
|---|---|---|---|---|---|---|---|
| Comparative Sample 1, PET | 180 | 22.0 | 23.0 | 1.6 | 0.2 | 0.1> | x |
| Comparative Sample 2, PPA | 300 | 11.2 | 11.2 | 0.3 | 0.3 | 2.8 | V-0 |
| Comparative Sample 3, PI | 300 | 17.6 | 12.0 | 0.3 | 0.3 | 1.3 | V-0 |

| | Electric Properties | | | | |
|---|---|---|---|---|---|
| Volume Intrinsic | Insulation Breakdown | Dielectric | Dielectric Loss | Solvent | Alkali |

TABLE 14-continued (Comparative Samples 1 to 3)

| Resistance | Voltage | Constant | Tangent | Resistance | Resistance | Hue |
|---|---|---|---|---|---|---|
| $3 \times 10^{16}$ | 280 | 3.2 | $6 \times 10^{-3}$ | o | o | Colorless and transparent |
| $5 \times 10^{16}$ | 220 | 3.4 | $4 \times 10^{-3}$ | o | x | Colorless and transparent |
| $2 \times 10^{18}$ | 276 | 3.5 | $3 \times 10^{-3}$ | o | x | Brown and transparent |

It is seen from Tables 6 to 14 that heat resistance of Samples 5 to 12 of the present invention is markedly improved in comparison with nontreated film (Comparative Sample 1) composed of only PET base substrate, that the coating layer serves to give excellent heat resistance, and that, in spite that PET is used as base substrate, they possess heat resistance approaching that of films (Comparative Samples 2 and 3) containing only PPA or PI. For example, of the present invention samples, those baked at even 200° C. show about 50° C. better heat resistance than the nontreated film (Comparative Sample 1) composed of only PET base substrate, and Samples 5 to 12 of the present invention baked at a temperature as high as 270° C. or more show heat resistance approaching that of nontreated films (Comparative Samples 2 and 3) composed of only PPA or PI. It can be seen from this that samples of the present invention show markedly improved heat resistance properties in comparison with nontreated corresponding films. Therefore, it is apparent that these samples of the present invention can find broader applications than nontreated films. In addition, heat contraction ratio becomes so less than that of PET base substrate itself, and becomes about the same as that of engineering plastics. This excellent properties and the above-described tendency of heat resistance being markedly improved of samples of the present invention (for example, samples of the present invention baked at 300° C.) permit to use them in place of films containing engineering plastics as base substrate. Samples of the present invention show better heat resistance as the baking temperature is raised, and show about the same fire retardance as that of Comparative Samples 2 and 3, and show generally good adhesion to base substrate, solvent resistance, etc., markedly small water absorbing ratio in comparison with Comparative Samples 2 and 3, and better alkali resistance than Comparative Samples 2 and 3. Samples of the present invention baked at 270° C. or more have a heat resistance temperature of 250° C. Hence, it is apparent that they can be used as FPC base films, etc., for which heat resistance and fire retardance of about 250° C. are required.

The third group films of the present invention are functional films wherein base substrate 100 is composed of one resin selected from among both the first group resins (PET, PPS, PSF, PES, and PEI) and the second group resins (PVC, PC, PAR, TAC, and MMA) and coating layer 200 is composed of a silicone resin or a fluorine resin. In this third group films, the thin film is preferably formed by using an aqueous solution or alcohol solution of the silicone resin or the fluorine resin when the base substrate is composed of the second group resin. When the base substrate is composed of the first group resin, there is no such limitation, and hence such solvents as ketones and N,N-dimethylformamide may be used. As is the same with the second group films, the thickness of base substrate 100 be within the scope of 1 to 350μ, and that of coating layer (dry) be 1 to 10μ, from the standpoint of handling properties, strength, degree of freedom in designing, etc. Baking temperature be preferably selected from between 150° and 300° C. from the standpoint of heat resistance, adhesion between base substrate and coating layer, bleeding from base substrate, etc. Example 4 with functional films belonging to the third group films are shown below.

EXAMPLE 4

Four kinds of functional films (Samples 13 to 16 of the present invention) of the structure shown in Table 15 were prepared according to the process of the present invention, and characteristic properties of them were examined with changing the baking temperature. The results are shown in Tables 16 to 19. For comparison, characteristic properties of nontreated films (Comparative Samples 4 and 5) containing PET and fluorine resin respectively as base substrate are shown in Table 20. Additionally, methods for testing the characteristic properties are conducted in the same manner as in Example 1.

TABLE 15

| | Kind of Substrate | Thickness of Substrate (μ) | Coating Solution (kind of resin) | Thickness of Coating (dry) (μ) | Coating-Formed Position |
|---|---|---|---|---|---|
| Sample 13 of the Invention | PET | 25 | Phenol-modified fluorine resin | 3/3 | Both sides |
| Sample 14 of the Invention | PET | 25 | Polyamidoimide-modified fluorine resin | 3/3 | Both sides |
| Sample 15 of the Invention | PC | 50 | Polytetrafluoroethylene | 3/3 | Both sides |
| Sample 16 of the Invention | PAR | 50 | Polytetrafluoroethylene | 3/3 | Both sides |

In Table 15, EMRALON GP-1904 (made by Acheson Industries, Inc.) was used as the phenol-modified fluorine resin, EMRALON EM-333 (made by Acheson Industries, Inc.) as the polyamidoimide-modified fluorine resin, and Teflon PTFE-850 (made by E.I. Du Pont de Nemours & Co.) as the polytetrafluoroethylene.

TABLE 16

(Sample 13 of the Invention)

| Baking Time (min) | Baking Temp. (°C.) | Adhesion | Heat Resistance (°C.) | Tensile Strength (kgf/cm²) MD | Tensile Strength (kgf/cm²) TD | Heat Contraction Ratio MD (%) | Heat Contraction Ratio TD (%) | Water Absorption Ratio (%) | Fire Retardance UL-94 |
|---|---|---|---|---|---|---|---|---|---|
| 5 | 145 | x | 180 | 20.2 | 21.4 | 0.9 | 0.3 | 0.2 | V-0 |
| 5 | 150 | Δ | 200 | 19.5 | 20.2 | 0.6 | 0.3 | 0.2 | V-0 |
| 4 | 230 | o | 220 | 19.1 | 18.7 | 0.5 | 0.3 | 0.1 | V-0 |
| 3 | 270 | o | 250 | 13.1 | 12.7 | 0.3 | 0.2 | 0.1 | V-0 |
| 2 | 300 | o | 250 | 10.1 | 10.2 | 0.2 | 0.2 | 0.1 | V-0 |
| 2 | 305 | | | Impossible to mold | | | | | |

| Electric Properties | | | | | |
|---|---|---|---|---|---|
| Volume Intrinsic Resistance | Insulation Breakdown Voltage | Dielectric Constant | Dielectric Loss Tangent | Solvent Resistance | Alkali Resistance |
| $2 \times 10^{17}$ | 310 | 2.7 | 0.006 | o | o |
| $2 \times 10^{17}$ | 310 | 2.7 | 0.006 | o | o |
| $2 \times 10^{17}$ | 310 | 2.7 | 0.006 | o | o |
| $2 \times 10^{17}$ | 310 | 2.7 | 0.006 | o | o |
| $2 \times 10^{17}$ | 310 | 2.7 | 0.006 | o | o |
| | | Impossible to mold | | | |

TABLE 17

(Sample 14 of the Invention)

| Baking Time (min) | Baking Temp. (°C.) | Adhesion | Heat Resistance (°C.) | Tensile Strength (kgf/cm²) MD | Tensile Strength (kgf/cm²) TD | Heat Contraction Ratio MD (%) | Heat Contraction Ratio TD (%) | Water Absorption Ratio (%) | Fire Retardance UL-94 |
|---|---|---|---|---|---|---|---|---|---|
| 5 | 145 | x | 180 | 19.5 | 20.6 | 0.9 | 0.3 | 0.2 | V-0 |
| 5 | 150 | Δ | 200 | 18.0 | 21.1 | 0.7 | 0.2 | 0.2 | V-0 |
| 4 | 230 | Δ | 220 | 18.6 | 19.4 | 0.4 | 0.2 | 0.2 | V-0 |
| 3 | 270 | o | 250 | 14.1 | 15.0 | 0.3 | 0.1 | 0.1 | V-0 |
| 2 | 300 | o | 250 | 10.4 | 10.6 | 0.2 | 0 | 0.1 | V-0 |
| 2 | 305 | | | Impossible to mold | | | | | |

| Electric Properties | | | | | |
|---|---|---|---|---|---|
| Volume Intrinsic Resistance | Insulation Breaksown Voltage | Dielectric Constant | Dielectric Loss Tangent | Solvent Resistance | Alkali Resistance |
| $3 \times 10^{17}$ | 320 | 2.8 | 0.004 | o | o |
| $3 \times 10^{17}$ | 320 | 2.8 | 0.004 | o | o |
| $3 \times 10^{17}$ | 320 | 2.8 | 0.004 | o | o |
| $3 \times 10^{17}$ | 320 | 2.8 | 0.004 | o | o |
| $3 \times 10^{17}$ | 320 | 2.8 | 0.004 | o | o |
| | | Impossible to mold | | | |

TABLE 18

(Sample 15 of the Invention)

| Baking Time (min) | Baking Temp. (°C.) | Adhesion | Heat Resistance (°C.) | Tensile Strength (kgf/cm²) MD | Tensile Strength (kgf/cm²) TD | Heat Contraction Ratio MD (%) | Heat Contraction Ratio TD (%) | Water Absorption Ratio (%) | Fire Retardance UL-94 |
|---|---|---|---|---|---|---|---|---|---|
| 5 | 145 | x | 170 | 8.0 | 8.2 | 0.6 | 0.8 | 0.2 | V-0 |
| 5 | 150 | Δ | 170 | 8.0 | 8.1 | 0.6 | 0.7 | 0.2 | V-0 |
| 4 | 230 | Δ | 240 | 7.8 | 8.0 | 0.5 | 0.5 | 0.2 | V-0 |
| 3 | 270 | o | 250 | 7.3 | 7.3 | 0.7 | 0.4 | 0.1 | V-0 |
| 2 | 300 | o | 250 | 7.5 | 7.4 | 0.8 | 0.5 | 0.1 | V-0 |
| 2 | 305 | | | Impossible to mold | | | | | |

| Electric Properties | | | | | |
|---|---|---|---|---|---|
| Volume Intrinsic Resistance | Insulation Breaksown Voltage | Dielectric Constant | Dielectric Loss Tangent | Solvent Resistance | Alkali Resistance |
| $6.0 \times 10^{16}$ | 350 | 3.0 | 0.004 | o | o |
| $6.0 \times 10^{16}$ | 350 | 3.0 | 0.004 | o | o |
| $6.0 \times 10^{16}$ | 350 | 3.0 | 0.004 | o | o |
| $6.0 \times 10^{16}$ | 350 | 3.0 | 0.004 | o | o |

TABLE 18-continued (Sample 15 of the Invention)

| | | | | | |
|---|---|---|---|---|---|
| $6.0 \times 10^{16}$ | 350 | 3.0 | 0.004 | o | o |
| | | Impossible to mold | | | |

TABLE 19

(Sample 16 of the Invention)

| Baking Time (min) | Baking Temp. (°C.) | Adhesion | Heat Resistance (°C.) | Tensile Strength (kgf/cm$^2$) MD | TD | Heat Contraction Ratio MD (%) | TD (%) | Water Absorption Ratio (%) | Fire Retardance UL-94 |
|---|---|---|---|---|---|---|---|---|---|
| 5 | 145 | x | 170 | 7.1 | 6.8 | 0.0 | 0.2 | 0.2 | V-0 |
| 5 | 150 | Δ | 170 | 7.1 | 6.7 | 0.1 | 0.1 | 0.2 | V-0 |
| 4 | 230 | Δ | 240 | 7.2 | 7.2 | 0.2 | 0.0 | 0.2 | V-0 |
| 3 | 270 | o | 250 | 7.3 | 7.2 | 0.2 | 0.1 | 0.1 | V-0 |
| 2 | 300 | o | 260 | 7.4 | 7.2 | 0.2 | 0.2 | 0.1 | V-0 |
| 2 | 305 | | | | Impossible to mold | | | | |

| Electric Properties | | | | | |
|---|---|---|---|---|---|
| Volume Intrinsic Resistance | Insulation Breaksown Voltage | Dielectric Constant | Dielectric Loss Tangent | Solvent Resistance | Alkali Resistance |
| $3.5 \times 10^{16}$ | 290 | 2.9 | 0.005 | o | o |
| $3.5 \times 10^{16}$ | 290 | 2.9 | 0.005 | o | o |
| $3.5 \times 10^{16}$ | 290 | 2.9 | 0.005 | o | o |
| $3.5 \times 10^{16}$ | 290 | 2.9 | 0.005 | o | o |
| $3.5 \times 10^{16}$ | 290 | 2.9 | 0.005 | o | o |
| | | Impossible to mold | | | |

TABLE 20

(Comparative Samples 4 and 5)

| | Heat Resistance (°C.) | Tensile Strength (kgf/cm$^2$) MD | TD | Heat Contraction Ratio MD (%) | TD (%) | Water Absorption Ratio (%) | Fire Retardance UL-94 |
|---|---|---|---|---|---|---|---|
| Comparative Sample 4, PET | 180 | 22.0 | 23.0 | 1.6 | 0.2 | 0.1> | x |
| Comparative Sample 5, Fluorine resin | 260 | 2.9 | 2.75 | 0.5 | −2.0 | <0.01 | V-0 |

| | Electric Properties | | | | |
|---|---|---|---|---|---|
| | Volume Intrinsic Resistance | Insulation Breakdown Voltage | Dielectric Constant | Dielectric Loss Tangent | Solvent Resistance | Alkali Resistance |
| | $3 \times 10^{16}$ | 280 | 3.2 | $6 \times 10^{-3}$ | o | o |
| | $1 \times 10^{18}$ | 430 | 2.1 | $2 \times 10^{-4}$ | o | o |

It is seen from Tables 16 to 20 that heat resistance of Samples 13 to 16 of the present invention is markedly improved in comparison with nontreated film (Comparative Sample 4) composed of only PET base substrate, so that the coating layer serves to give excellent heat resistance, and that, in spite that PET is used as base substrate, they possess heat resistance approaching that of film (Comparative Sample 5) containing only a fluorine resin. For example, of the present invention samples, those baked at even 150° C. show about 20° C. better heat resistance than the nontreated film (Comparative Sample 4) composed of only PET base substrate, and Samples 13 to 16 of the present invention baked at a temperature as high as 270° C. or more show heat resistance approaching that of nontreated film (Comparative Sample 5) composed of only the fluorine resin. It can be seen from this that samples of the present invention show markedly improved heat resistance properties in comparison with nontreated corresponding films. In addition, heat contraction ratio becomes excellent as compared with that of PET base substrate itself, and becomes about the same as that of engineering plastics.

Therefore, samples of the present invention (baked, for example, at a baking temperature of 300° C.) can be used as substitutes for films containing engineering plastics as base substrate. The samples of the present invention show better heat resistance as the baking temperature is raised, and show about the same fire retardance as that of Comparative Sample 5, show generally good adhesion to base substrate, solvent resistance, etc., and show about the same alkali resistance as that of Comparative Samples 4 and 5. Samples of the present invention baked at 270° C. or more have a heat resistance temperature of 250° C. or more. Hence, it is apparent that they can be used as FPC base films, etc., for which heat resistance and fire retardance of about 250° C. are required.

The fourth group films of the present invention are functional films wherein base substrate 100 is composed of TAC or MMA and coating layer 200 is composed of one, two or more resins selected from among phenol resin, epoxy resin, and melamine resin. As is the same with the second and third group films, the thickness of base substrate 100 be within the scope of 1 to 350μ, and that of coating layer 200 (dry) be 1 to 10μ, from the standpoint of handling properties, strength, degree of freedom in designing, etc. As is the same with the third group films, baking temperature be selected from between 150° and 300° C. from the standpoint of heat resistance, adhesion between base substrate and coating layer, bleeding from base substrate, etc. Example 5 with functional films belonging to the fourth group are shown below.

EXAMPLE 5

Two kinds of functional films (Samples 17 and 18 of the invention) of the structure shown in Table 21 were prepared according to the process of the present invention, and characteristic properties of them were examined with changing the baking temperature. The results are shown in Tables 22 and 23. For comparison, characteristic properties of nontreated films (Comparative Samples 6 to 8) containing TAC, MMA, and PI respectively as base substrate are shown in Table 24. Additionally, methods for testing the characteristic properties are conducted in the same manner as in Example 1.

TABLE 21

|  | Kind of Substrate | Thickness of Substrate (μ) | Coating Solution (kind of resin) | Thickness of Coating (dry) (μ) | Coating-Formed Position |
|---|---|---|---|---|---|
| Sample 17 of the Invention | TAC | 50 | Phenol | 3/3 | Both sides |
| Sample 18 of the Invention | MMA | 50 | Melamine | 3/3 | Both sides |

TABLE 22

(Sample 17 of the Invention)

| Baking Time (min) | Baking Temp. (°C.) | Adhesion | Heat Resistance (°C.) | Tensile Strength (kgf/cm$^2$) MD | TD | Heat Contraction Ratio MD (%) | TD (%) | Water Absorption Ratio (%) | Fire Retardance UL-94 |
|---|---|---|---|---|---|---|---|---|---|
| 5 | 145 | Δ | 210 | 12.8 | 12.6 | 2.3 | 2.2 | 0.9 | V-0 |
| 5 | 150 | o | 220 | 12.7 | 12.6 | 2.3 | 2.1 | 0.9 | V-0 |
| 5 | 230 | o | 240 | 11.3 | 11.6 | 1.2 | 1.3 | 0.9 | V-0 |
| 3 | 270 | o | 260 | 10.4 | 10.2 | 1.1 | 1.0 | 0.9 | V-0 |
| 2 | 300 | o | 260 | 8.6 | 8.3 | 0.9 | 0.9 | 0.9 | V-0 |
| 2 | 305 |  |  | Impossible to mold |  |  |  |  |  |

| Electric Properties | | | | | | |
|---|---|---|---|---|---|---|
| Volume Intrinsic Resistance | Insulation Breakdown Voltage | Dielectric Constant | Dielectric Loss Tangent | Solvent Resistance | Alkali Resistance | Hue |
| 2.8 × 10$^{16}$ | 230 | 3.3 | 0.012 | o | o |  |
| 2.8 × 10$^{16}$ | 230 | 3.3 | 0.012 | o | o |  |
| 2.8 × 10$^{16}$ | 230 | 3.3 | 0.012 | o | o | Brown and |
| 2.8 × 10$^{16}$ | 230 | 3.3 | 0.012 | o | o | transparent |
| 2.8 × 10$^{16}$ | 230 | 3.3 | 0.012 | o | o |  |
|  |  |  | Impossible to mold |  |  |  |

TABLE 23

(Sample 18 of the Invention)

| Baking Time (min) | Baking Temp. (°C.) | Adhesion | Heat Resistance (°C.) | Tensile Strength (kgf/cm$^2$) MD | TD | Heat Contraction Ratio MD (%) | TD (%) | Water Absorption Ratio (%) | Fire Retardance UL-94 |
|---|---|---|---|---|---|---|---|---|---|
| 5 | 145 | Δ | 120 | 7.2 | 7.1 | 11.0 | 11.2 | 0.32 | V-0 |
| 5 | 150 | o | 130 | 6.8 | 6.6 | 10.3 | 9.8 | 0.32 | V-0 |
| 5 | 230 | o | 170 | 6.2 | 6.5 | 1.2 | 1.3 | 0.32 | V-0 |
| 3 | 260 | o | 210 | 5.3 | 5.4 | 0.9 | 0.7 | 0.32 | V-0 |
| 1 | 300 | o | 210 | 4.5 | 5.0 | 0.9 | 0.7 | 0.32 | V-0 |
| 1 | 305 |  |  | Impossible to mold |  |  |  |  |  |

| Electric Properties | | | | | | |
|---|---|---|---|---|---|---|
| Volume Intrinsic Resistance | Insulation Breakdown Voltage | Dielectric Constant | Dielectric Loss Tangent | Solvent Resistance | Alkali Resistance | Hue |
| 2.6 × 10$^{16}$ | 250 | 3.0 | 0.035 | o | o |  |
| 2.6 × 10$^{16}$ | 250 | 3.0 | 0.035 | o | o |  |
| 2.6 × 10$^{16}$ | 250 | 3.0 | 0.035 | o | o | Colorless and |
| 2.6 × 10$^{16}$ | 250 | 3.0 | 0.035 | o | o | transparent |
| 2.6 × 10$^{16}$ | 250 | 3.0 | 0.035 | o | o |  |

TABLE 23-continued (Sample 18 of the Invention)

Impossible to mold

TABLE 24

(Comparative Samples 6 to 8)

| | Heat Resistance (°C.) | Tensile Strength (kgf/cm³) | | Heat Contraction Ratio | | Water Absorption Ratio (%) | Fire Retardance UL-94 |
|---|---|---|---|---|---|---|---|
| | | MD | TD | MD (%) | TD (%) | | |
| Comparative Sample 6, TAC | 210 | 10–13 | 10–13 | 3–4 | 3–4 | 3.3–3.8 | V-0 |
| Comparative Sample 7, MMA | 90 | 7.4 | 7.4 | 12 | 0 | 0.35 | x |
| Comparative Sample 8, PI | 300 | 17.6 | 12.0 | 0.05 | 0.05 | 1.3 | V-0 |

| Electric Properties | | | | | | |
|---|---|---|---|---|---|---|
| Volume Intrinsic Resistance | Insulation Breakdown Voltage | Dielectric Constant | Dielectric Loss Tangent | Solvent resistance | Alkali Resistance | Hue |
| $2.7 \times 10^{16}$ | 145 | 3.5 | 0.021 | Δ | Δ | Colorless and transparent |
| $2.3 \times 10^{16}$ | 220 | 2.8 | 0.06 | Δ | o | Colorless and transparent |
| $2 \times 10^{18}$ | 276 | 3.5 | 0.003 | o | x | Brown and transparent |

It is seen from Tables 22 to 24 that heat resistance of Samples 17 and 18 of the present invention is markedly improved in comparison with the base substrate of non-treated films (Comparative Samples 6 and 7), that the coating layer serves to give excellent heat resistance, and that the sample containing TAC as base substrate shows a heat resistance approaching that of the film (Comparative Sample 8) containing only PI as base substrate. For example, of samples of the present invention, those baked at even 150° C. show about 10° C. better heat resistance than the nontreated film (Comparative Sample 6) composed of only TAC base substrate, and Sample 17 of the present invention baked at a temperature as high as 270° C. or more shows heat resistance approaching that of nontreated film (Comparative Sample 8) composed of only PI. In addition, heat contraction ratio of Samples 17 and 18 of the present invention is less than that of the base substrate, TAC and MMA, and better contraction resistance is attained as the baking temperature is raised. In addition, samples of the present invention show about the same adhesion between base substrate and coating layer, solvent resistance, alkali resistance, fire retardance, properties of not absorbing water, etc., as that of those belonging to the second and third group films. Sample 17 of the present invention baked at 270° C. or more has a heat resistance temperature of 260° C. or more. Hence, it is apparent that it can be used as FPC base film, etc.

INDUSTRIAL APPLICABILITY

As has been described hereinbefore, the functional films of the present invention have good heat resistance, fire retardance, properties of not absorbing water, solvent resistance, chemical resistance, flexibility, optical properties, elongation and contraction resistance upon being heated, degree of freedom in designing, adhesion between base substrate and coating layer, etc., and hence they can be widely used in the field of electronics including base films for FPC, condensers, or transparent electrode, heat resistance conductive films, films for liquid crystal, IC carrier tapes, etc., membranes for use in dialysis, diffusion, etc., interior materials for aircraft and automobiles, devices related to atomic power industry, building materials, industrial materials, food wrapping materials, medical materials, cloth materials, etc.

What is claimed is:

1. A process for producing a functional film, which comprises a step of forming a thin film of a solution of one, two or more resins selected from among phenol resin, epoxy resin, melamine resin, silicone resin, fluorine resin, polyimide resin, polyamidoimide resin, polyparabanic acid resin, and polyhydantoin resin on one or both sides of a base substrate composed of a flexible thermoplastic resin, and a step of baking said thin film at 130° to 300° C. for 0.5 to 5 minutes with keeping it in a flatly form-retained state without looseness using a clipping mechanism to form a coating layer.

2. The process as claimed in claim 1, wherein a base substrate composed of one of polyvinyl chloride resin, polycarbonate resin, polyarylate resin, polyethylene terephthalate resin, polyphenylene sulfide resin, polysulfone resin, polyether sulfone resin, and polyether imide resin is used, and a phenol resin solution is used as the resin solution for forming the thin film.

3. The process as claimed in claim 2, wherein said base substrate has a thickness of 1 to 1,000μ, and said coating layer has a thickness of 1 to 10μ.

4. The process as claimed in claim 1, wherein a base substrate composed of one of polyethylene terephthalate resin, polyphenylene sulfide resin, polysulfone resin, polyether sulfone resin, and polyether imide resin is used as said base substrate, a solution of one, two or more resins selected from among polyimide resin, polyamidoimide resin, polyparabanic acid resin, and polyhydantoin resin or a solution of a mixture of said resin and one, two or more resins selected from among phenol resin, epoxy resin, and melamine resin is used as said resin solution for forming the thin film, and baking of the formed thin film is conducted at 200° to 300° C.

5. The process as claimed in claim 4, wherein said base substrate has a thickness of 1 to 350μ, and said coating layer has a thickness of 1 to 10μ.

6. The process as claimed in claim 1, wherein a base substrate composed of one of polyethylene terephthalate resin, polyphenylene sulfide resin, polysulfone resin, polyether sulfone resin, polyetherimide resin, polyvinyl chloride resin, polycarbonate resin, polyarylate resin, triacetate resin, and methyl methacrylate resin is used as said base substrate, a solution of silicone resin or fluorine resin is used as a resin solution for forming the thin film, and baking of the formed thin film is conducted at 150° to 300° C.

7. The process as claimed in claim 6, wherein said base substrate has a thickness of 1 to 350μ, and said coating layer formed has thickness of 1 to 10μ.

8. The process as claimed in claim 6, wherein a base substrate composed of one of polyvinyl chloride resin, polycarbonate resin, polyarylate resin, triacetate resin, and methyl methacrylate resin is used as said base substrate, and an aqueous solution or alcohol solution of silicone resin or fluorine resin is used as said resin solution for forming said thin film.

9. The process as claimed in claim 1, wherein a base substrate composed of a triacetate resin or a methyl methacrylate resin is used as said base substrate, a solution of one, two or more resins selected from among phenol resin, epoxy resin, and melamine resin is used as said thin film-forming resin solution, and baking of the formed thin film is conducted at 150° to 300° C.

10. The process as claimed in claim 9, wherein said base substrate has a thickness of 1 to 350μ, and said coating layer formed has a thickness of 1 to 10μ.

* * * * *